United States Patent [19]
Voldman et al.

[11] Patent Number: 6,015,993
[45] Date of Patent: Jan. 18, 2000

[54] SEMICONDUCTOR DIODE WITH DEPLETED POLYSILICON GATE STRUCTURE AND METHOD

[75] Inventors: Steven H. Voldman, South Burlington; Robert J. Gauthier, Jr., Hinesburg; Jeffrey S. Brown, Middlesex, all of Vt.

[73] Assignee: International Business Machines Corporation, Armonk, N.Y.

[21] Appl. No.: 09/144,386

[22] Filed: Aug. 31, 1998

[51] Int. Cl.[7] .......................... H01L 23/62; H01L 29/76; H01L 29/00
[52] U.S. Cl. .......................... 257/355; 257/356; 257/339; 257/328; 257/546
[58] Field of Search ..................................... 257/367, 373, 257/570, 328, 339, 440, 546, 551, 577, 355–363, 173

[56] References Cited

U.S. PATENT DOCUMENTS

| | | |
|---|---|---|
| 4,492,974 | 1/1985 | Yoshida et al. . |
| 4,516,223 | 5/1985 | Erickson . |
| 4,616,404 | 10/1986 | Wang et al. . |
| 4,760,433 | 7/1988 | Young et al. ............................ 257/357 |
| 4,760,434 | 7/1988 | Tsuzuki et al. . |
| 4,896,199 | 1/1990 | Tsuzuki et al. . |
| 5,128,731 | 7/1992 | Lien et al. . |
| 5,136,348 | 8/1992 | Tsuzuki et al. . |
| 5,227,655 | 7/1993 | Kayama . |
| 5,365,099 | 11/1994 | Phipps et al. . |
| 5,449,937 | 9/1995 | Arimura et al. ........................ 257/344 |
| 5,502,338 | 3/1996 | Suda et al. . |
| 5,543,642 | 8/1996 | Byrne ..................................... 257/355 |
| 5,589,415 | 12/1996 | Blanchard . |
| 5,602,046 | 2/1997 | Calafut et al. . |
| 5,602,404 | 2/1997 | Chen et al. ............................. 257/112 |
| 5,629,544 | 5/1997 | Voldman et al. . |
| 5,631,187 | 5/1997 | Phipps et al. . |
| 5,661,069 | 8/1997 | Owens et al. . |
| 5,841,172 | 11/1998 | Morishita et al. ...................... 257/355 |

FOREIGN PATENT DOCUMENTS

401185971  7/1989  Japan ..................................... 257/355

*Primary Examiner*—Tom Thomas
*Assistant Examiner*—Ori Nadav
*Attorney, Agent, or Firm*—Whitham, Curtis & Whitham; Eugene I. Shkurko

[57] ABSTRACT

A high voltage tolerant diode structure for mixed-voltage, and mixed signal and analog/digital applications. The preferred silicon diode includes a polysilicon gate structure on at least one dielectric film layer on a semiconductor (silicon) layer or body. A well or an implanted area is formed in a bulk semiconductor substrate or in a surface silicon layer on an SOI wafer. Voltage applied to the polysilicon gate film, electrically depletes it, reducing voltage stress across the dielectric film. An intrinsic polysilicon film may be counter-doped, implanted with a low doped implantation, implanted with a low doped source/drain implant, or with a low doped MOSFET LDD or extension implant. Alternatively, a block mask may be formed over the gate structure when defining the depleted-polysilicon gate silicon diode to form low series resistance diode implants, preventing over-doping the film. Optionally, a hybrid photoresist method mey be used to form higher doped edge implants in the silicon to reduce diode series resistance without a block mask.

15 Claims, 15 Drawing Sheets

SEMICONDUCTOR DIODE WITH DEPLETED POLYSILICON GATE STRUCTURE AND METHOD

RELATED APPLICATIONS

The present invention is related to U.S. patent applications Ser. No. 08/715,288, entitled "Low K Factor Hybrid Resist" to S. Holmes et al. and Ser. No. 08/715,287, entitled "Frequency Doubling Photoresist" to M. C. Hackey et al., both filed Sep. 16, 1996; Ser. No. 08/852,850, entitled "Structure and Process for Buried Diode Formation in CMO" to J. S. Brown et al., filed May 7, 1997; Ser. No. 08/852,466, entitled "Method and Structure to Reduce Latchup Using Edge Implants" to F. D. Baker et al., filed May 7, 1997; and Ser. No. 08/851,973, entitled "ESD Protection Structure and Method" to J. S. Brown et al., filed May 7, 1997.

BACKGROUND OF THE INVENTION

1. Field of the Invention

The present invention generally relates to integrated circuit chips and more particularly to electrostatic discharge protect devices for integrated circuit chips.

2. Background Description

As semiconductor device features are shrunk with each new technology generation, device insulating layers are thinned proportionately, i.e., "scaling". These thinner dielectric layers fail at lower voltages. Consequently, polysilicon gate structure scaling increases circuit sensitivity to voltage stress, electrical overstress (EOS) and electrostatic discharge (ESD) failures. These types of failures are a major concern in insulated gate field effect transistor (FET) technologies, typically referred to as MOSFET. This is especially true for MOSFET chips that interface to other chips or signals with voltages above that of the MOSFET chip itself.

Figure 1A:
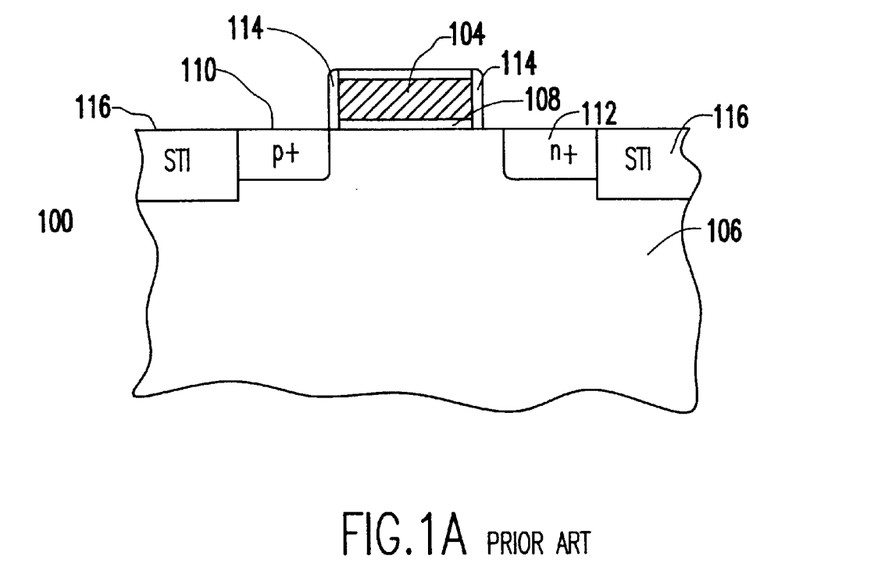
FIGS. 1A–B are cross-sectional views of a prior art diode structures.
Figure 1B:
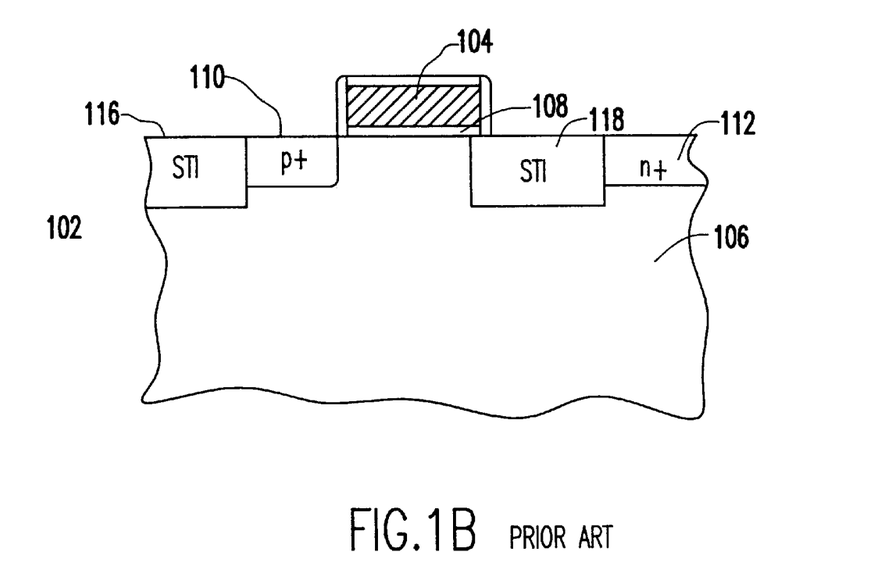

FIGS. 1A–B, are cross-sectional views of a prior art protect device structures 100, 102. Each device includes a gate 104 insulated from a semiconductor body 106 by an insulator layer 08.

In FIG. 1A, the device 100 is a lightly doped drain (LDD) field effect transistor diode with a p-type diffusion 110 on one side of the gate 104 and an n-type diffusion 112 is on the opposite side. Nitride spacers 114 over lightly doped regions (not shown) on each side of the gate 104, insure that the edges of the gate 104 are spaced away from diffusions 110 and 112. Shallow trench isolation (STI) 116 is provided at each diffusion 110, 112 to isolate the device 100 from adjacent circuits.

In FIG. 1B a p-type diffusion 110 is on one side of and adjacent to the gate 104 and shallow trench isolation 118 separates the gate from n-type diffusion 112. In both of these prior art devices, the gate 104 is either n-type or p-type polysilicon.

Normally, integrated circuit (IC) chips include protect devices or diodes such as those in FIGS. 1A or 1B in interface circuits to provide the IC chip with added ESD protection. U.S. Pat. No. 5,629,544, entitled "Semiconductor Diode with Silicide Films and Trench Isolation" to Voldman et al. teaches using diode structures bound by polysilicon for bulk silicon and silicon on insulator (SOI) MOSFET applications. However, where MOSFET chips must interface with higher voltage signals or, chips operating at voltages above the MOSFET's native voltage, these polysilicon protect devices do not provide adequate protection. ESD type failures are the result of this inadequate protection.

Further, on some SOI chips ESD protection is provided by a lateral unidirectional bipolar type insulated gate transistor known as a Lubistor. Lubistors are also sensitive to the dielectric stress.

Thus, there is a need for thin oxide diodes that are less sensitive to dielectric failures from electric field stress.

SUMMARY OF THE INVENTION

It is therefore a purpose of the present invention to reduce integrated circuit chip dielectric field stress failures.

It is another purpose of the present invention to improve MOSFET circuit ESD protection.

It is yet another purpose of the present invention to improve SOI chip ESD protection.

The present invention is a high voltage tolerant diode structure that may be used in mixed-voltage, and mixed signal and analog/digital applications. The preferred diode includes a low doped polycilicon gate structure on at least one dielectric film layer on a semiconductor (silicon) layer or body. The polysilicon diode is in a film shorted at one surface by a conducting layer or cap. As voltage is applied to the polysilicon film, it electrically depletes reducing the voltage stress across the dielectric film. This depletable film is achieved by counter-doping the polysilicon or, by a low doped implantation of the polysilicon film. In one embodiment, a low doped source/drain implant is used to establish the polysilicon film dopant concentration. In another embodiment, a low doped MOSFET LDD or extension implant is used to establish the polysilicon gate dopant concentration. In yet another embodiment, a block mask is formed over the gate structure when defining the depleted polysilicon diode to form low series resistance diode implants, thereby preventing over-doping the gate structure. In an alternate embodiment, a higher doped edge implant is defined in the structure in silicon at a spacer edge using a hybrid photoresist method to increase the dopant concentration on the edge implants, reducing diode series resistance without using a block mask. The preferred diode structure is formed on a well or an implanted area in a bulk semiconductor substrate.

In another embodiment the diode structure is a lateral unidirectional bipolar insulated gate type transistor (Lubistor) on a silicon-on-insulator (SOI) wafer. The preferred Lubistor is defined using a well implant of a surface silicon layer. A dielectric film is buried in the supporting silicon substrate.

Polysilicon depletion for preferred embodiment diode exhibit a unique capacitance—voltage (C-V) characteristic, with a unique voltage dependency for both preferred diodes and Lubistor structures. The polysilicon depletion may be used for both voltage stress reduction and in circuit applications, such as in diode-based ESD networks.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 2:
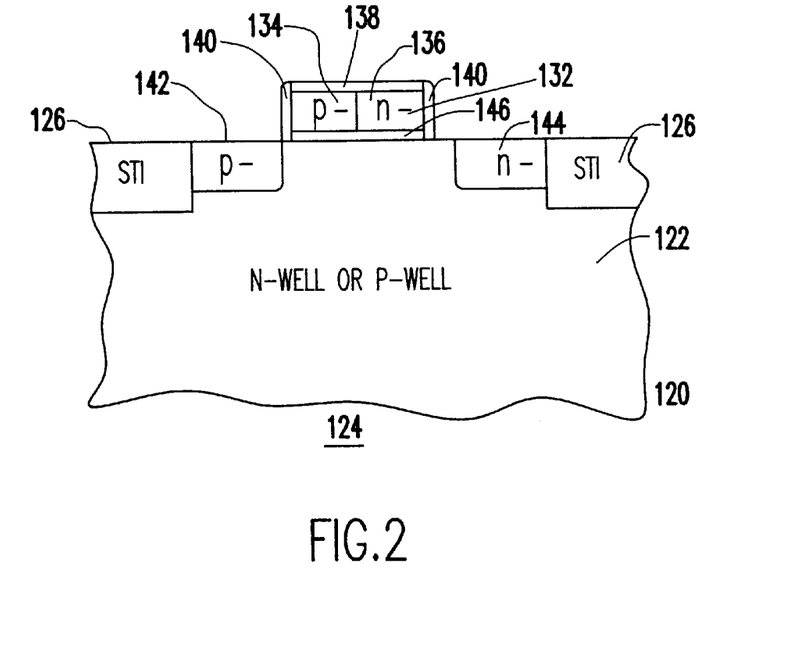
FIG. 2 is a cross-sectional view of a depleted polysilicon diode structure on a bulk substrate.

Referring now to the drawings, and more particularly to FIG. 2, which is a cross-sectional view of a first preferred embodiment depleted FET diode structure 120 on a well (P-well or N-well) or other implanted region 122 on a bulk substrate 124. Shallow trench isolation 126 at either side of the well 122 isolates the diode of this embodiment from neighboring structures.

Structures formed according to the present invention have at least one dielectric film 130 under a gate film 132, preferably a polysilicon film. The polysilicon gate film 132 of preferred embodiment diodes of the present invention has a first region 134 doped p-type adjacent a second region 136 doped n-type, forming a diode in the gate film 132. The two regions 134 and 136 may be connected together, electrically, by a conductor layer 138, preferably salicide, formed on the polysilicon gate film 132 and shorting the diode junction formed therein. Spacers 140 are provided at opposite sides of the polysilicon gate film 132. Diffusion 142 at region 134 and diffusion 144 at region 136, at each end of the gate film 132 are doped with like dopants, i.e., 142 is p-type and 144 is n-type.

Each diffusion 142, 144, is doped such that under appropriate bias conditions, a depletion layer (not shown) forms at surface 146. Preferably, the diffusions are doped to a dopant concentration of $1\times10^{14}/cm^2$ to $1\times10^{15}/cm^2$. Further, it is intended that as normal electrical stress increases, a depletion layer (not shown) forms at the bottom surface of one or both gate regions 134, 136, at the dielectric film 130. These depletion layers increase the effective gate dielectric thickness. As a result of the increased effective dielectric thickness, preferred embodiment diodes are capable of withstanding higher voltages.

As can be seen from the preferred embodiment of FIG. 2, a diode is formed between the well and depending on the well type, either p diffusion 142 or n diffusion 144. The overlying gate 132 acts as a silicide blocking mask, to prevent p-type and n-type implants from shorting together.

Figure 3A:
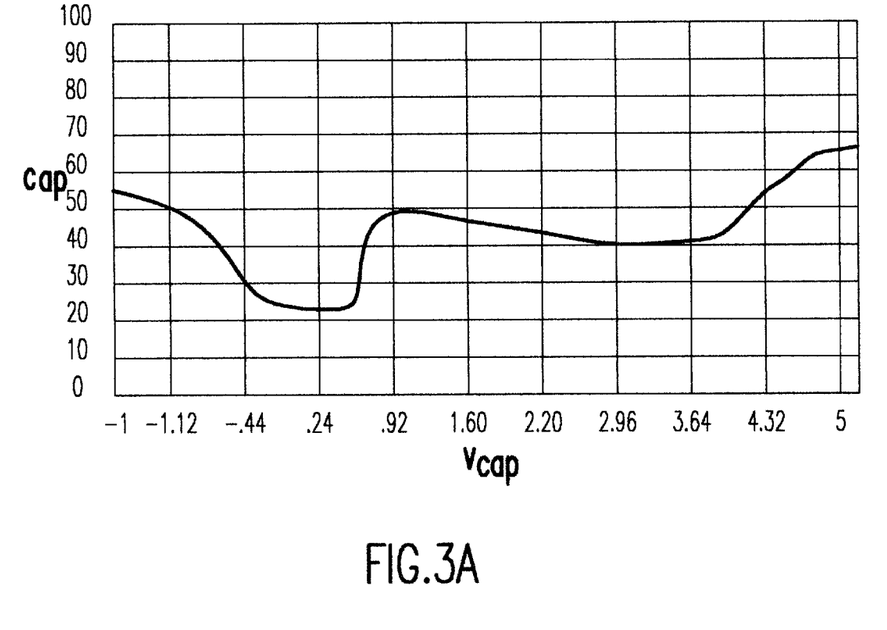
FIG. 3A is a C-V curve for a preferred embodiment diode.
Figure 3B:
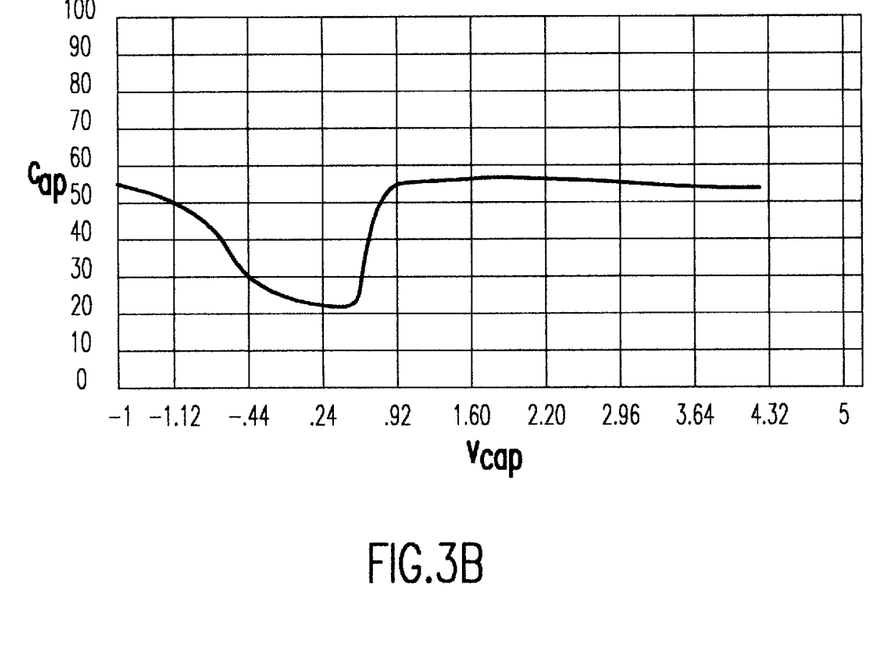
FIG. 3B is a C-V curve for a typical state of the art diode.

The polysilicon gate film 132 is depleted providing a unique C-V characteristic as represented in FIG. 3A. Thus, a preferred embodiment protect device has an improved capacitance voltage dependency over more conventional state of the art devices as represented in the C-V plot of FIG. 3B.

Further, the preferred embodiment high voltage tolerant diode 120 is a structure that may be used in mixed-voltage, mixed signal and analog/digital applications. The preferred depleted-polysilicon silicon diode structure 120 is defined by counter-doping the polysilicon gate layer 132 or, by a. low doped implantation of gate film 132, i.e., one order of magnitude below source drain dopant concentration, preferably $1\times10^{14}/cm^2$ to $1\times10^{15}/cm^2$. A low doped source/drain implant may be used to establish the polysilicon gate dopant concentration. Alternately, the polysilicon gate dopant concentration may be established using a low doped FET LDD or an extension implant.

Figure 4:
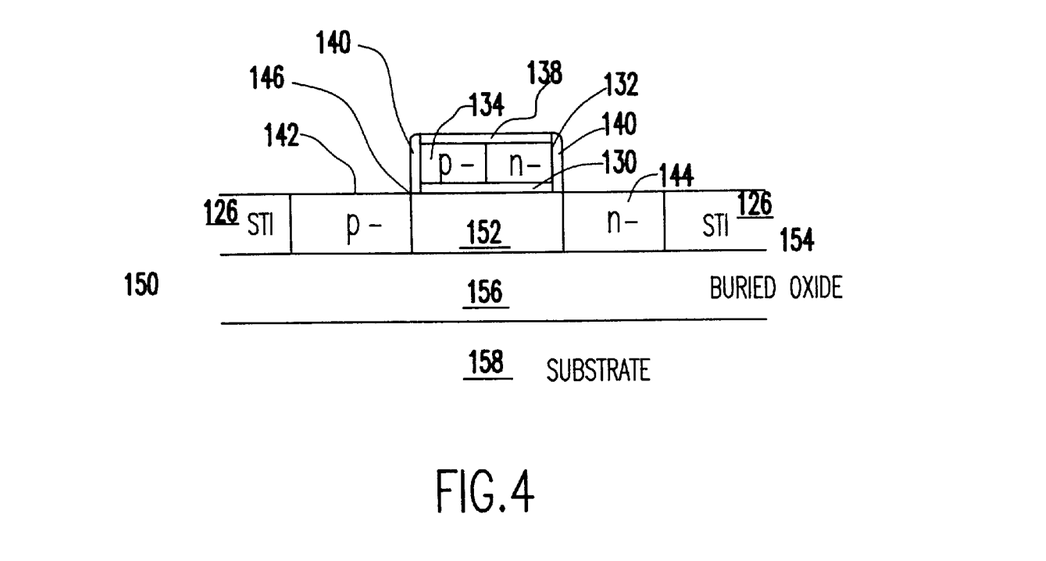
FIG. 4 is a cross-sectional view of a depleted polysilicon diode structure on a SOI wafer.

FIG. 4 is a cross-sectional view of a second preferred embodiment depleted FET diode structure 150 on a silicon on insulator (SOI) wafer. In this preferred embodiment, a lateral unidirectional bipolar type insulated gate transistor (Lubistor) is formed in an implanted well 152 in a surface semiconductor layer 154. The surface semiconductor layer 154 is on an insulator layer 156. Preferably, the insulator layer 156 is on a silicon wafer 158. As with the first preferred embodiment 120, the oxide layer 130 of the second preferred embodiment may be a single layer of insulating material or, two or more layers of insulating material.

Figure 5:
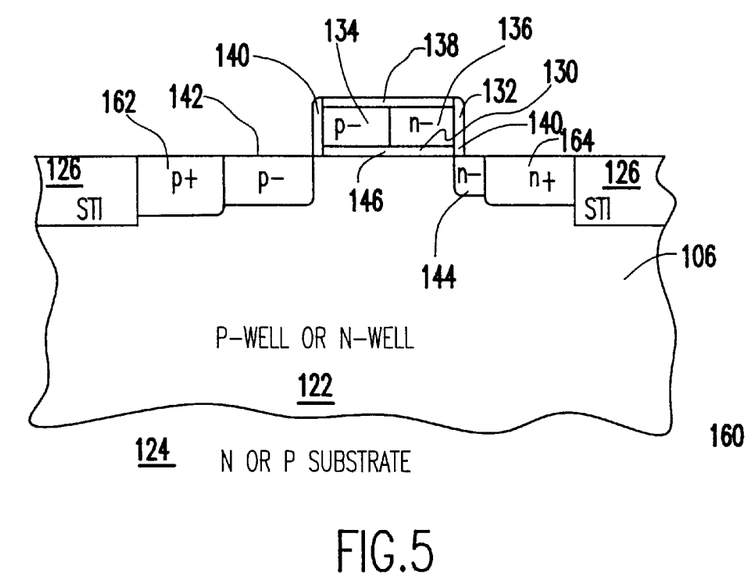
FIG. 5 is a cross-sectional view of a depleted polysilicon diode structure on a bulk wafer with integrated source/drain implants.

FIG. 5 is a cross-sectional view of an alternate embodiment that is a variation on FIG. 2. In this alternate embodiment 160, typical source/drain diffusions 162 and 164 are formed at STI 126. A block mask may be formed over the gate structure 132 when defining the depleted-polysilicon silicon diode to form a low series resistance in the silicon diode implants and to prevent over-doping the gate structure.

Figure 6:
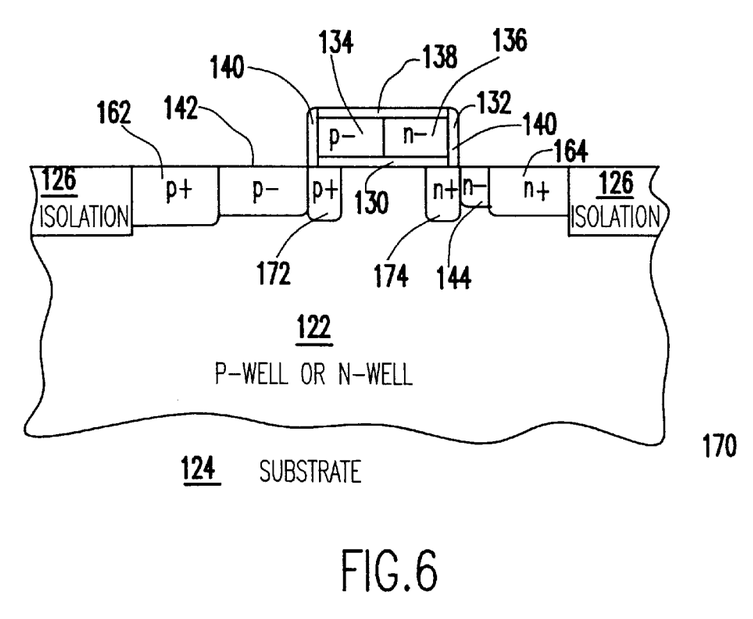
FIG. 6 is a cross-sectional view of a depleted polysilicon diode structure on a bulk wafer with hybrid resist edge implants.

FIG. 6 is a cross-sectional view of an alternate embodiment that is a variation on FIG. 4. In this alternate embodiment 170, additional edge implants 172 and 174 are provided at the edges of poly layer 132. Forming edge implants is described in U.S. patent application Ser. No. 08/852,466, entitled "Method and Structure to Reduce Latchup Using Edge Implants" to F. D. Baker, filed May 7, 1997, which is incorporated herein by reference. Edge implant 172 is p-type and edge implant 174 is n-type. These higher doped edge implant may be defined in the structure in silicon at the spacer edges using a hybrid photoresist method, such as described in U.S. patent application Ser. No. 08/715,288, entitled "Low K Factor Hybrid Resist" to S. Holmes et al., filed Sep. 16, 1996, which is incorporated herein by reference. Using a hybrid photoresist method increases the concentrated dopant edge implants and, thereby, reduces diode series resistance without requiring a block mask. Finally, in FIG. 7 a cross-sectional view of a third alternate embodiment 176 that is an SOI embodiment of the alternate embodiment of FIG. 6.

FIGS. 8A–D represent the steps in forming the preferred embodiment diode of FIGS. 2 and 4. First, in FIG. 8A, n or p wells formed in the surface 200 of a semiconductor (preferably silicon) substrate 120 or, for SOI, in the surface of a silicon layer 154. Then, shallow trenches 126 are formed. Next, in FIG. 8B, gate oxide 130 is grown on the surface 180. An undoped polysilicon gate 182 is formed on the gate oxide and sidewall spacers 140 are formed along the sidewalls of the gate 182. This is, essentially, the same starting point for most embodiments.

Figure 8A:
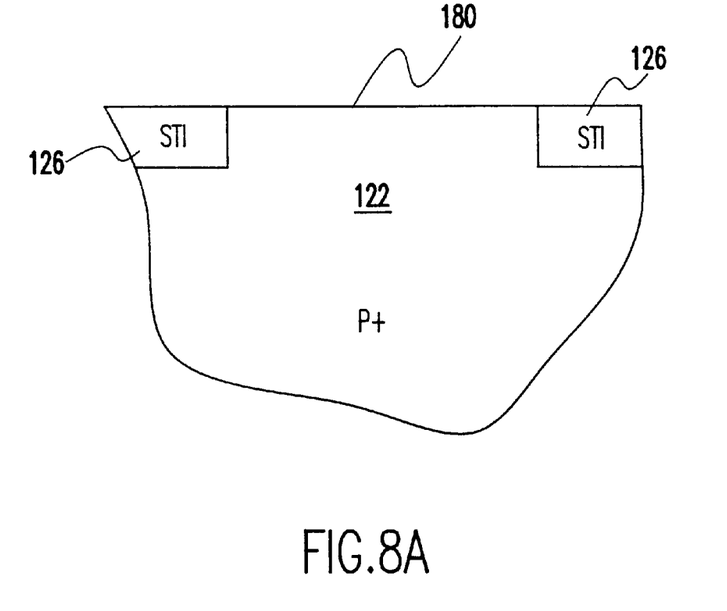
FIGS. 8A–D represent the steps in forming the preferred embodiment diode of FIGS. 2 and 4.
Figure 8B:
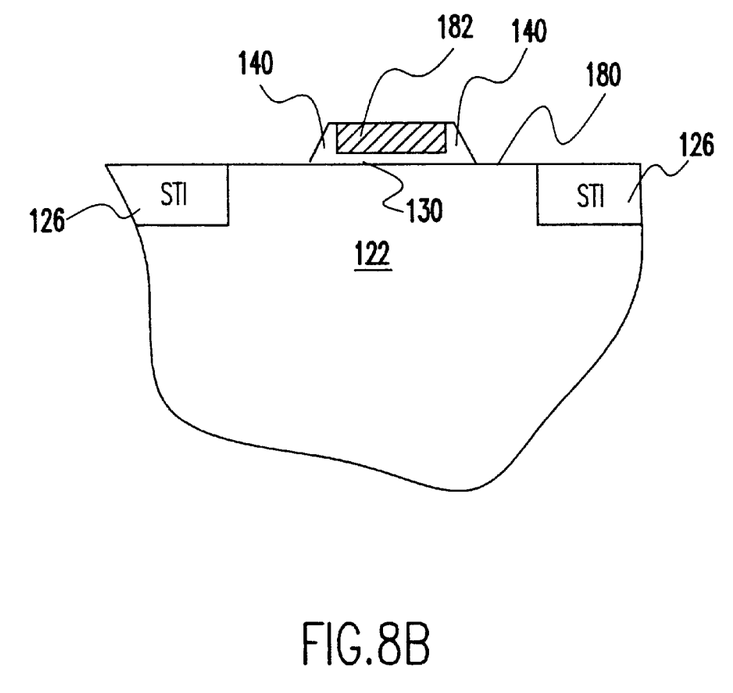
Figure 8C:
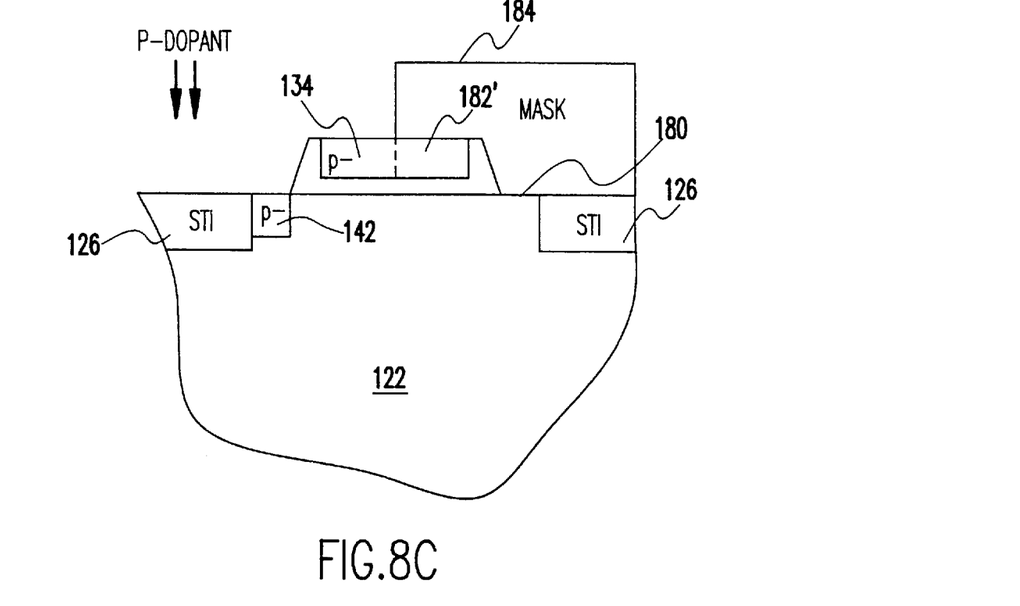
Figure 8D:
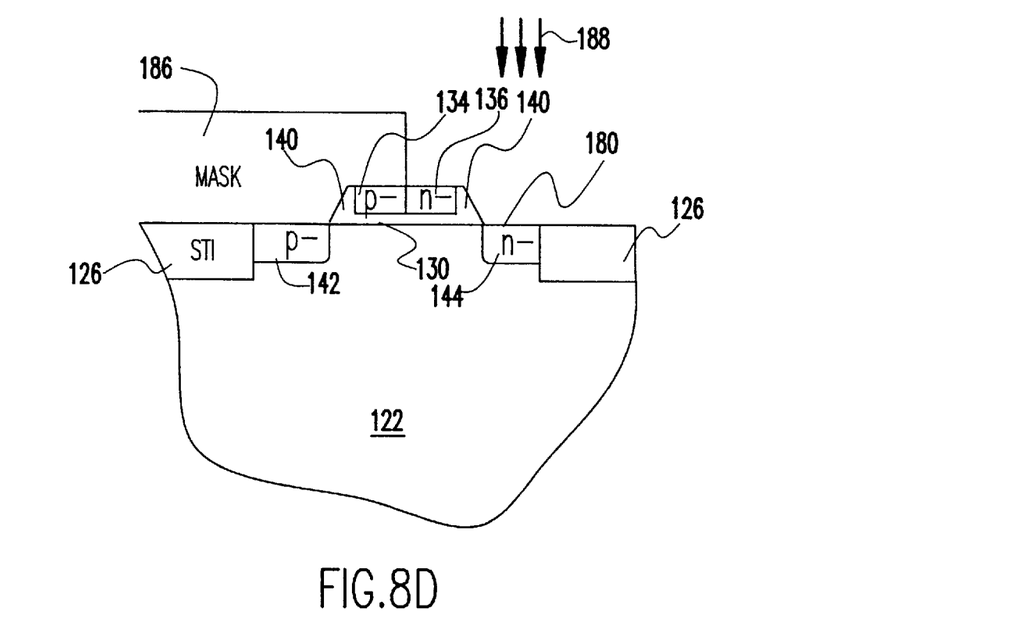

Next, in FIG. 8C, the surface 180 is masked 184 and p-type dopant is implanted into exposed areas forming p-type diffusions 142 and doping undoped polysilicon gate 182 in regions 134, leaving regions 182' undoped. The preferred embodiment low-doped polysilicon gate structure silicon diode is completed in FIG. 8D by masking 186 the surface 180 to cover previously exposed areas 134 and 142 and implanting unmasked areas with n-type dopant, represented by arrows 188, to form n-type diffusions 144 and doping undoped polysilicon gate 182 in regions 136.

Figure 9A:
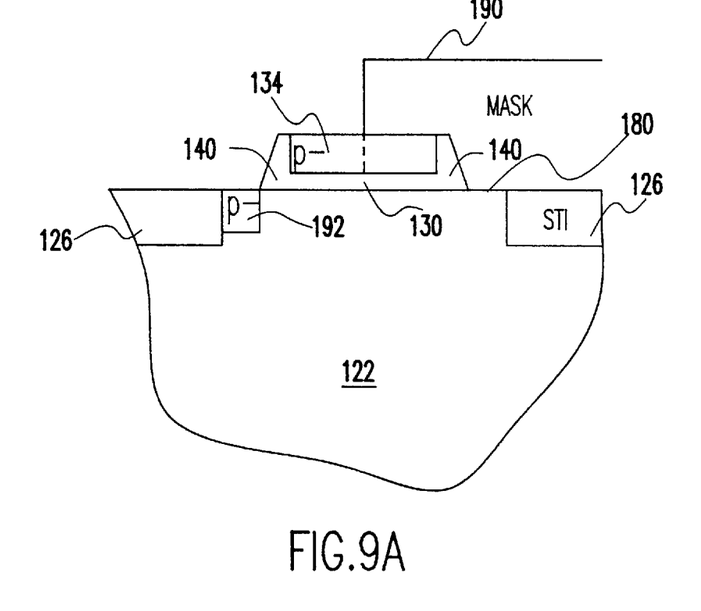
FIGS. 9A–D represent the steps in forming the preferred embodiment diode of FIG. 5.
Figure 9B:
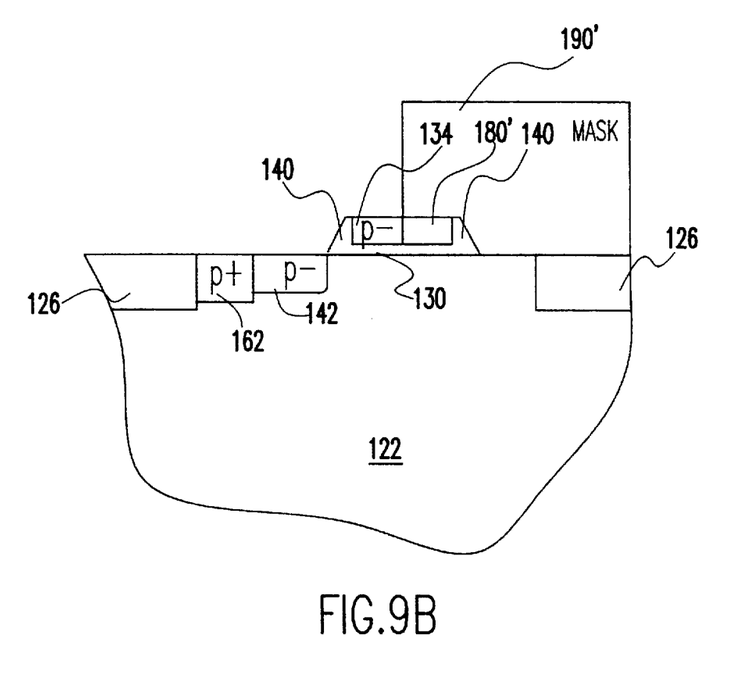
Figure 9C:
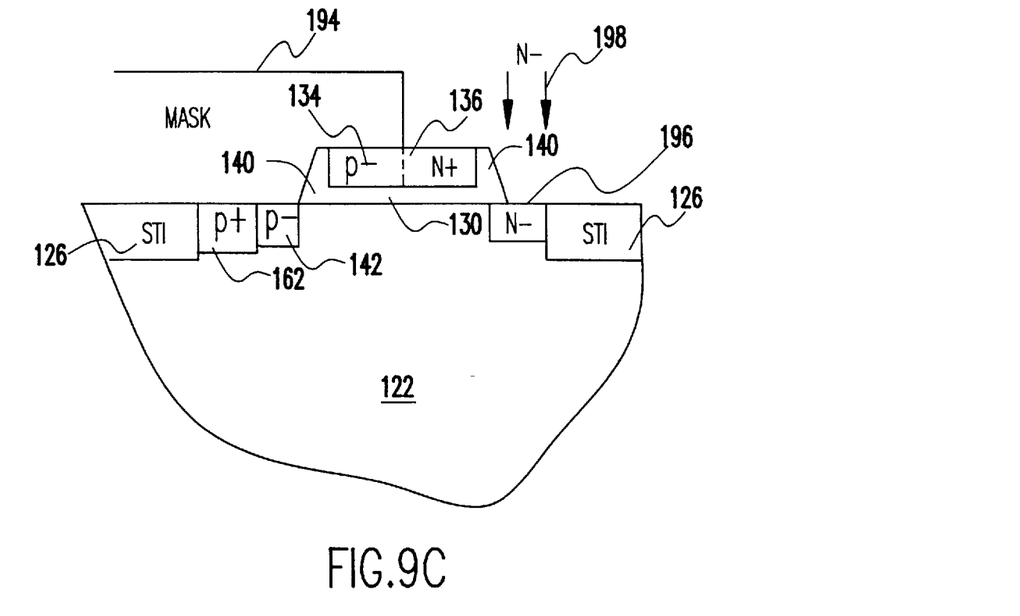
Figure 9D:
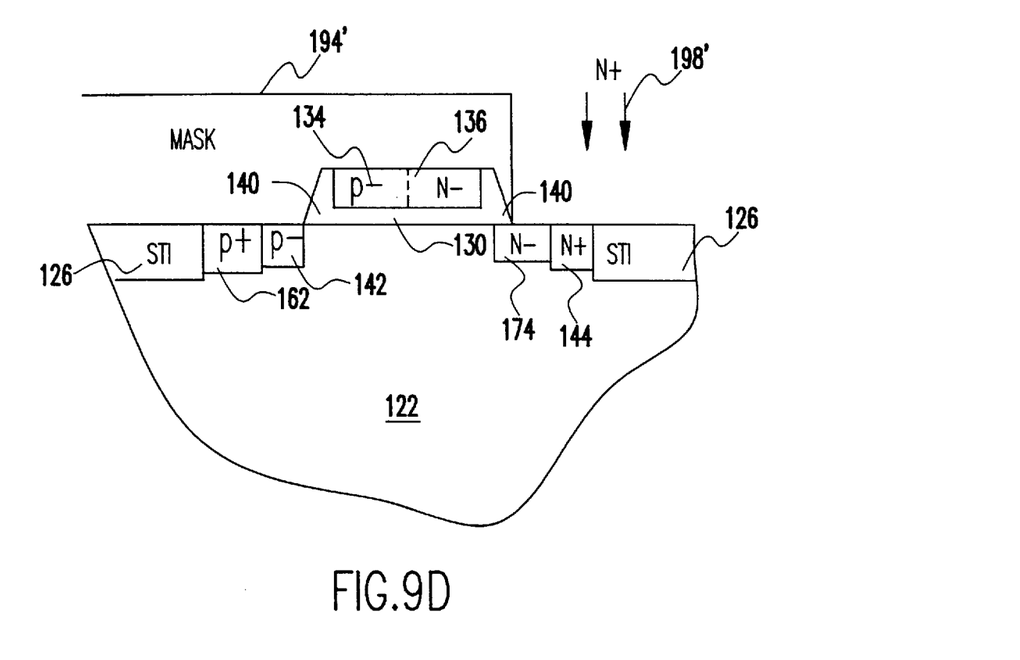
Figure 10A:
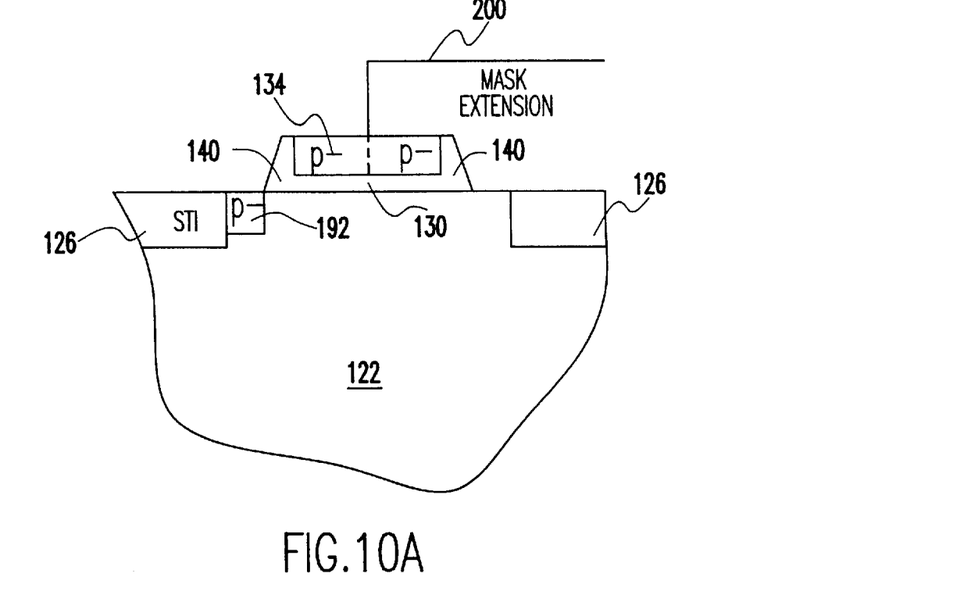
FIGS. 10A–D represent the steps in forming the preferred embodiment diode of FIG. 6.
Figure 10B:
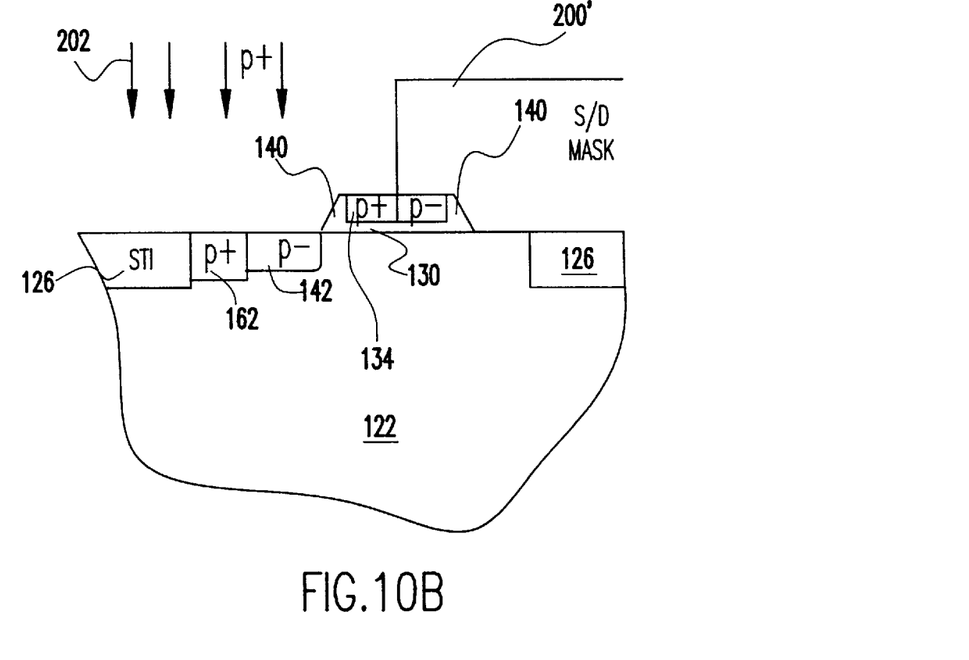
Figure 10C:
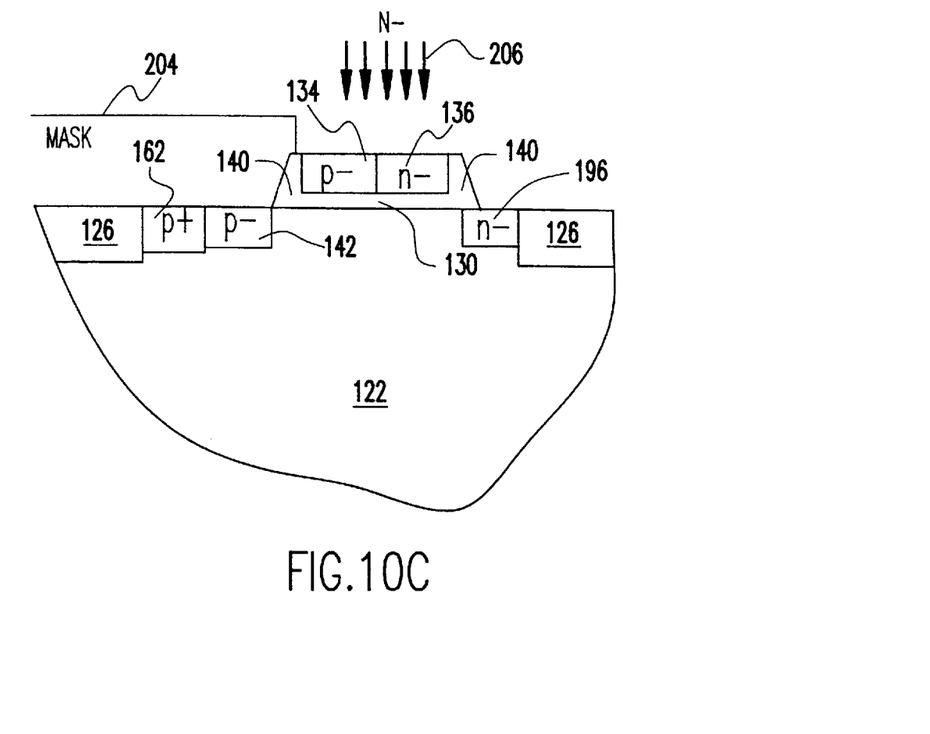
Figure 10D:
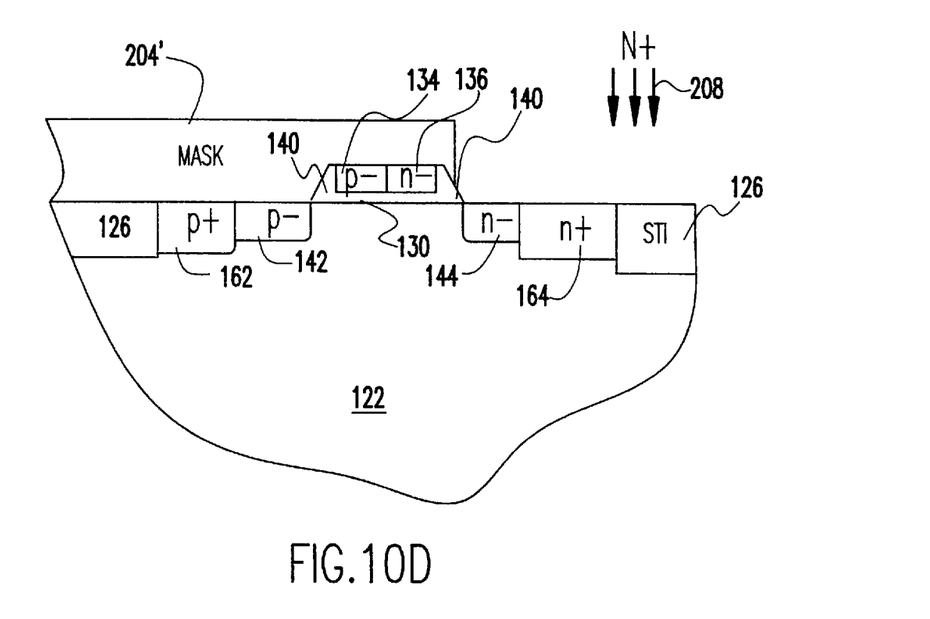

FIGS. 9A–D represent the steps in forming the preferred embodiment diode of FIG. 5 on the structure of FIG. 8B. In this embodiment, again, the surface 180, first, is masked 190 in FIG. 9A and implanted the exposed areas with p-type dopant to form gate regions 134 and p-type diffusions 192. This is followed, in FIG. 9B, by a second mask 190', which extends over p-doped polysilicon gate region 134. Then, remaining exposed areas are implanted with a second heavier concentration of p-type dopant to form region 162. In FIG. 9C, the p-type regions are masked 194 and the exposed areas are implanted with n-type dopant as represented by arrows 198 to form poly gate regions 136 and n-type diffusions 196. Finally, in FIG. 9D, a second mask 190', is formed extending over n-doped polysilicon gate region 136, followed by a second heavier concentration of n-type dopant to form region 144.

FIGS. 10A–D represent alternate steps in forming the preferred embodiment diode of FIG. 6 on the structure of FIG. 8B using counterdoping. In this embodiment, in FIG. 10A the entire undoped polysilicon gate 182 is exposed and, therefore, doped with p-type dopant coincident with p-type diffusions 192. Then, the mask 200 is extended in FIG. 10B and exposed areas are implanted with a second heavier concentration of p-type dopant, represented by arrows 202' to form region 162 and to further dope p-doped polysilicon gate region 134. After removing mask 200', in FIG. 10C a mask 204' is formed over p-type diffusions 142, 162. An n-type implant, represented by arrows 206, forms n-type diffusion region 196, and counter-dopes both polysilicon gate regions 134, 136 sufficiently to convert n-type polysilicon gate region 136 from a weak p-type region to an n-type region and to reduce the number of carriers in heavily doped p-type polysilicon gate region 134. Finally, in FIG. 10D, mask 204 is extended to cover both doped polysilicon gate regions 134, 136. After doping exposed areas with a heavier dopant concentration represented by arrows 208 to form regions 164, the extended mask 204' is removed.

Figure 7:
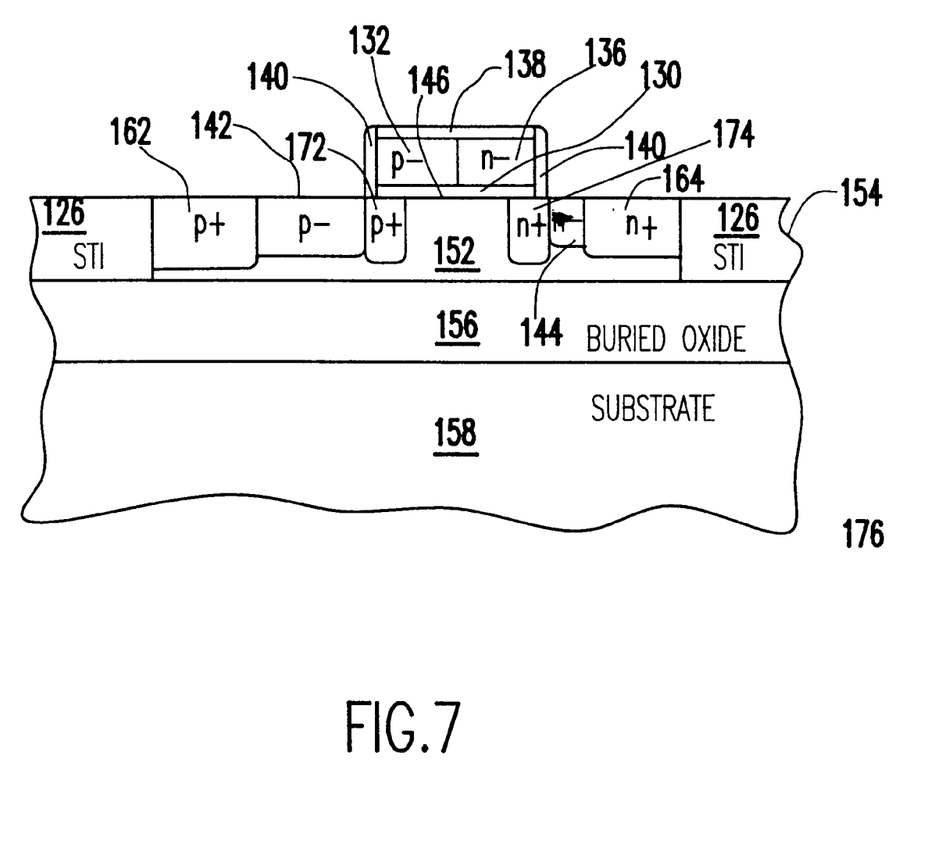
FIG. 7 is a cross-sectional view of a depleted polysilicon diode structure on an SOI wafer with hybrid resist edge implants.
Figure 11A:
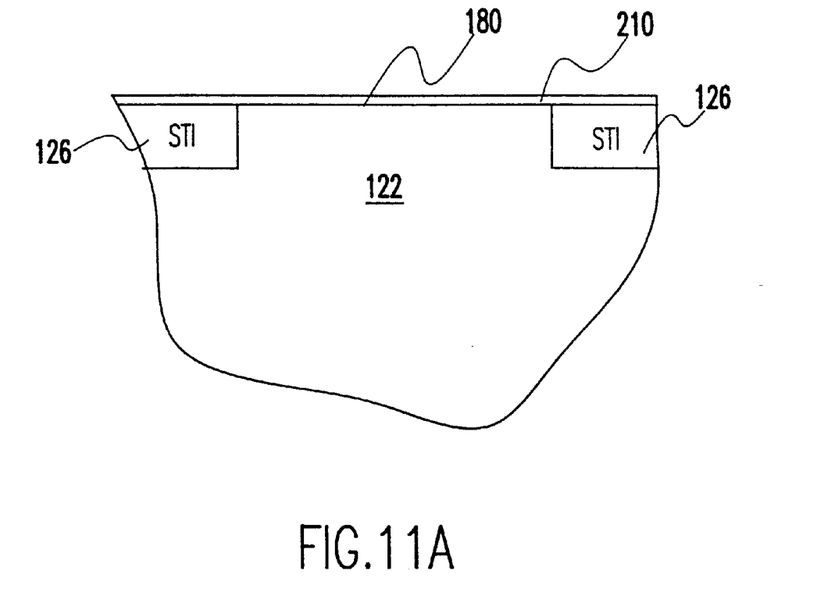
FIGS. 11A–E represent the steps in forming the preferred embodiment diode of FIG. 7.
Figure 11B:
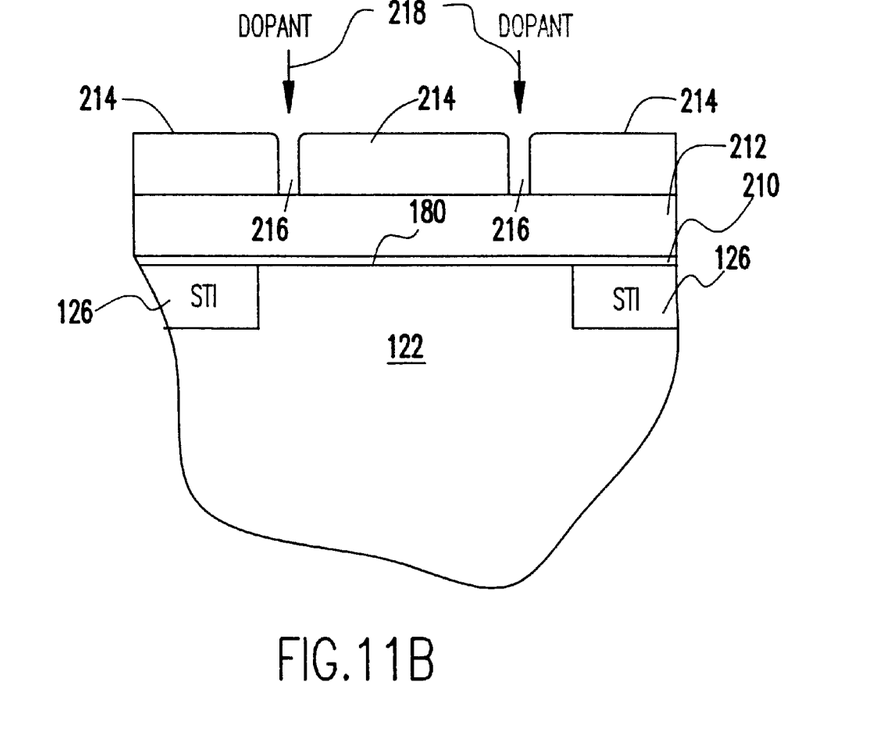
Figure 11C:
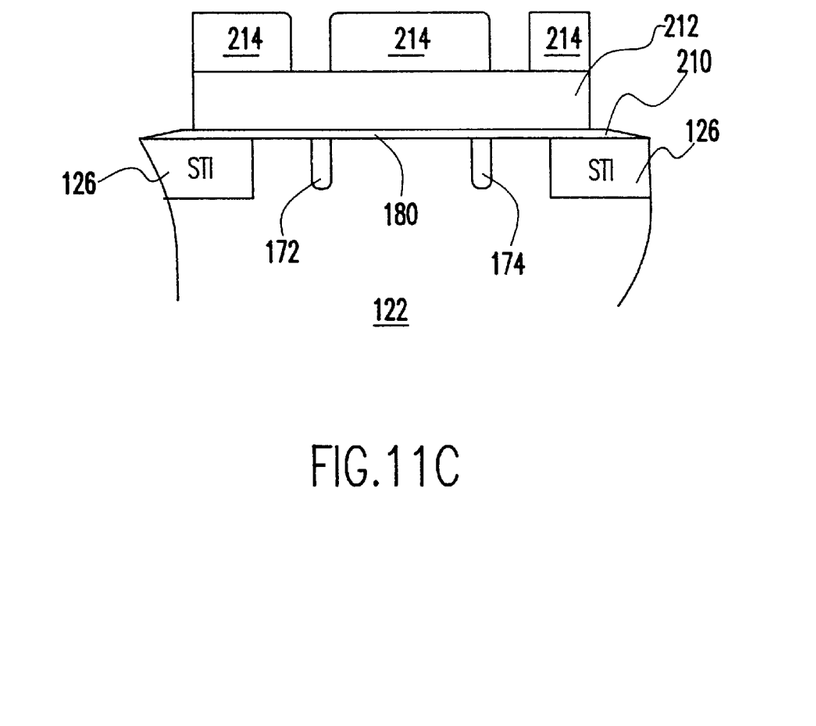
Figure 11D:
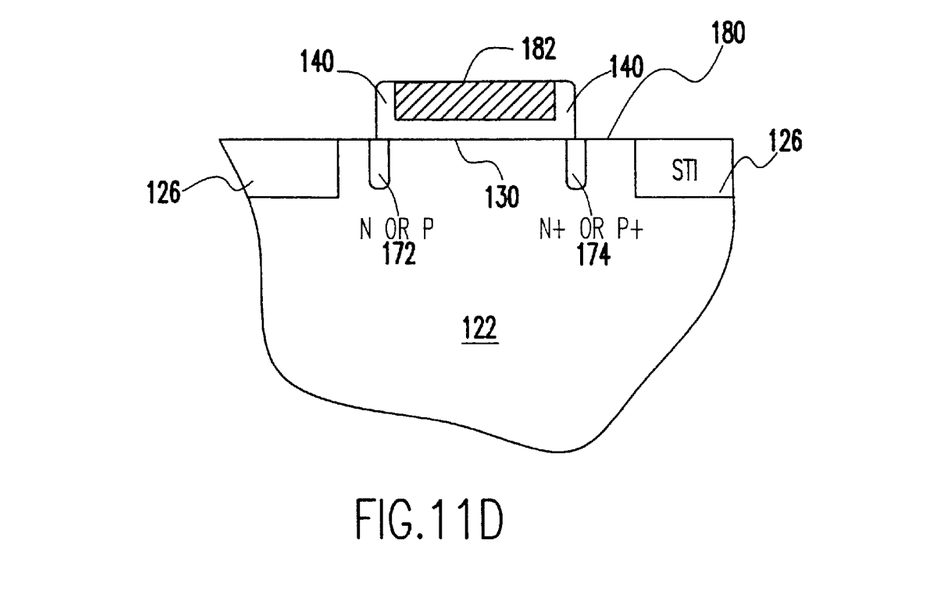
Figure 11E:
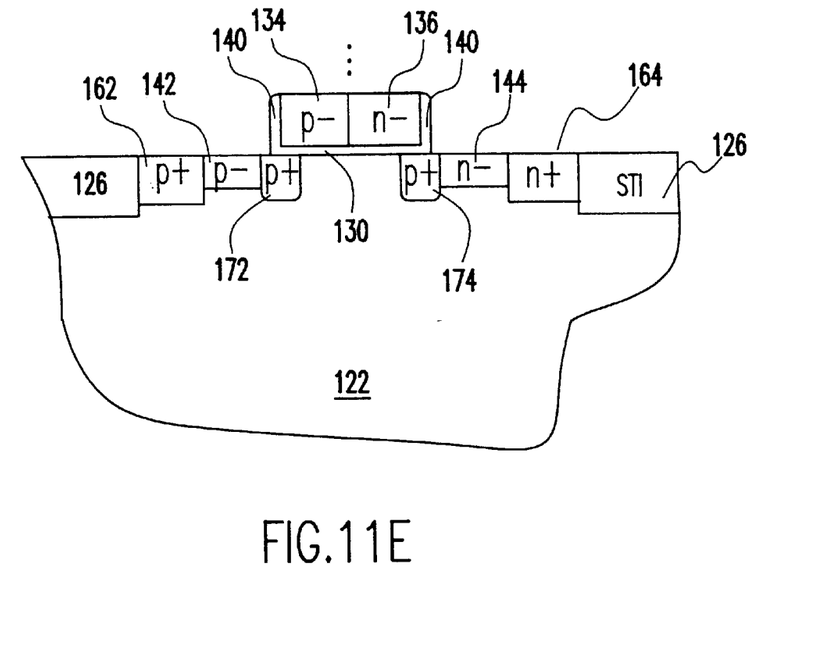

FIGS. 11A–D represent the steps in forming the preferred embodiment diode of FIG. 7 using a hybrid resist on the structure of FIG. 8A. In this embodiment, in FIG. 11A a gate dielectric layer 210, preferably SiO$_2$, is formed on the surface 180. Then, in FIG. 11B an undoped polysilicon layer 212 is formed on the gate dielectric layer 210. A mask pattern 214 is formed on the polysilicon layer 212 using a hybrid resist. The hybrid resist mask pattern forms very narrow apertures 216, through which a high concentration of n-type or p-type dopant, represented by arrows 218, is implanted into silicon layer 122, forming very localized implants 172, 174 in FIG. 11C. Next, the hybrid resist mask pattern 214 is removed and, in FIG. 1D, gate oxide 130 is grown on the surface 180. As in FIG. 8B, an undoped polysilicon gate 182 is formed on the gate oxide and sidewall spacers 140 are formed along the sidewalls of the gate 182. Finally, for this embodiment, the structure is completed using the steps described above for FIGS. 9A–D or the counter-doping steps described for FIGS. 10A–D, producing the structure of FIG. 11E.

Figure 12A:
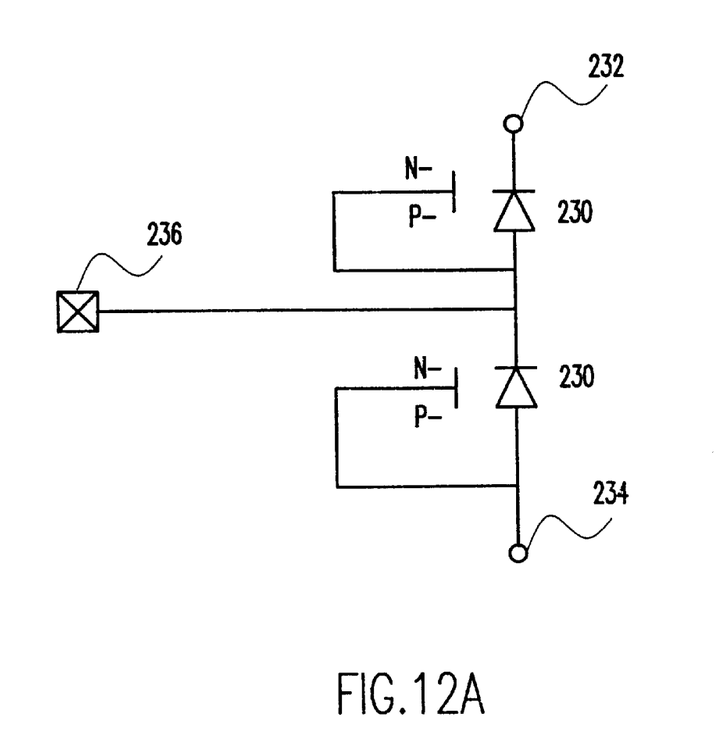
FIGS. 12A–C are electrical schematic symbols for preferred embodiment low-doped polysilicon gate structure silicon diode.
Figure 12B:
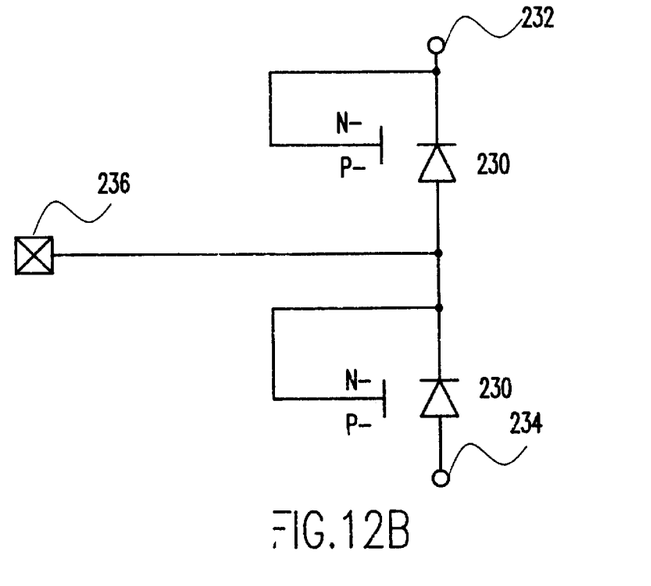
Figure 12C:
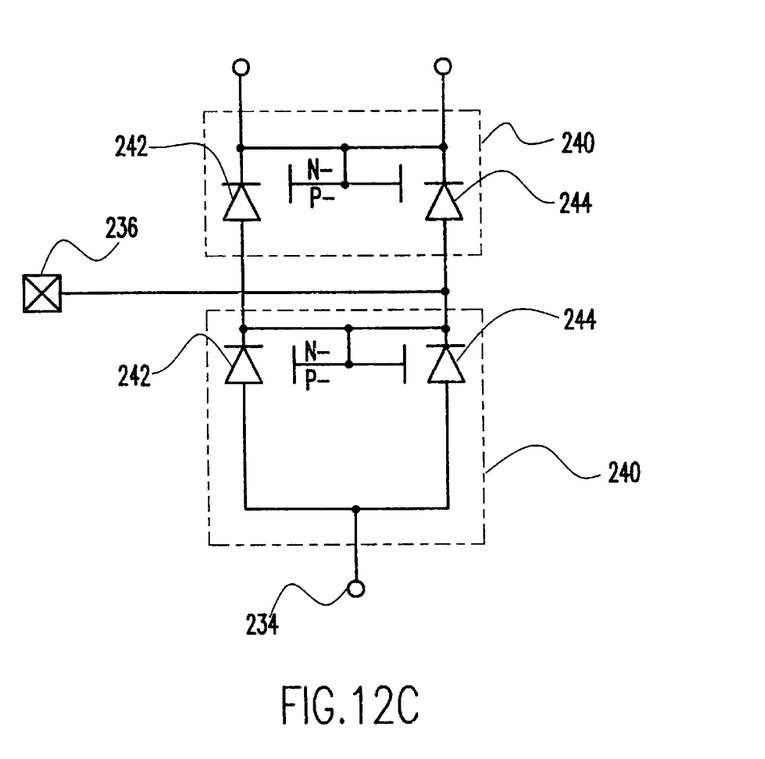

FIGS. 12A–C schematically show electrostatic discharge (ESD) networks. In FIGS. 12A–B, elements 230 are electrical schematic symbols for preferred embodiment low-doped polysilicon gate structure silicon diode of the present invention. It should be noted that application of silicide to the alters the characteristic of the resulting diode, with the ESD networks of FIGS. 12A and 12B being formed from diodes having silicided gates and the network of FIG. 12C being formed from diodes without.

So, in FIG. 12A, the two serially connected diodes 230 each are tied gate to anode and are connected serially between chip power supply rails 232, 234, i.e., $V_{dd}$ and $V_{ss}$. An Input/Output pad 236 is connected between the two diodes 230. In FIG. 12B, the two serially connected diodes 230 each are tied gate to cathode.

In FIG. 12C, each preferred embodiment structure 240 forms a pair of diodes 242, 244. Each pair of diodes includes a poly silicon diode 242 that includes 134, 136 and a silicon body or layer diode 244 that is the structure beneath the gate. In this preferred embodiment, the two serially connected diodes 240 each are tied gate to cathode.

While the invention has been described in terms of preferred embodiments, those skilled in the art will recognize that the invention can be practiced with modification within the spirit and scope of the appended claims.

We claim:

1. A semiconductor chip comprising:
   a semiconductor layer including a first conduction region of a first conduction type and a second conduction region of a second conductivity type;
   a dielectric layer on said semiconductor layer; and
   a conducting layer on said dielectric layer between said first conduction region and said second conduction region, said conducting layer having a first region of a first conductivity type and a second region of a second conductivity type, said first region being electrically shorted to said second region, said first region being adjacent to said first conduction region and said second region being adjacent to said second conduction region, wherein at least one of said first and second conduction regions and said conducting layer is lightly doped or counter-doped such that a thickness of a depletion region in a respective one of said semiconductor layer and said conducting layer adjacent said dielectric layer increases in thickness with increasing electrical stress.

2. The semiconductor chip of claim 1 further comprising a dielectric spacer on sidewalls of the conducting layer.

3. The semiconductor chip of claim 2 wherein said first conduction region and said second conduction region each have a trench along one side.

4. The semiconductor chip of claim 3 wherein the semiconductor layer is a silicon layer and the conducting layer is polysilicon.

5. The semiconductor chip of claim 4 wherein the silicon layer is a silicon wafer.

6. The semiconductor chip of claim 5 wherein said first conduction region and said second conduction region each include at least two doped regions, a first doped region of said at least two doped regions being doped to a dopant concentration lower than a second doped region of said at least two doped regions.

7. The semiconductor chip of claim 6 wherein said first doped region is between the second doped region and said polysilicon layer.

8. The semiconductor chip of claim 6 wherein at least two doped regions is three doped regions, said first doped region being doped to a dopant concentration lower than both of the other two of said three doped regions.

9. The semiconductor chip of claim 8 wherein said first doped region is between the other two.

10. The semiconductor chip of claim 4 wherein the silicon layer is on an insulating layer.

11. The semiconductor chip of claim 10 wherein said first conduction region and said second conduction region each include at least two doped regions, a first doped region of said at least two doped regions being doped to a dopant concentration lower than a second doped region of said at least two doped regions.

12. The semiconductor chip of claim 11 wherein said first doped region is between the second doped regions and said polysilicon layer.

13. The semiconductor chip of claim 11 wherein at least two doped regions is three doped regions, said first doped region being doped to a dopant concentration lower than both of the other two of said three doped regions.

14. The semiconductor chip of claim 13 wherein said first doped region is between the other two.

15. The semiconductor chip as recited in claim 1, wherein a dopant concentration in said at least one of said first and second conduction regions and said conducting layer is in the range of $10^{14}/cm^2$ to $10^{15}/cm^2$.

\* \* \* \* \*